US006621212B1

(12) United States Patent
Pennaz et al.

(10) Patent No.: US 6,621,212 B1
(45) Date of Patent: Sep. 16, 2003

(54) ELECTROLUMINESCENT LAMP STRUCTURE

(75) Inventors: Thomas J. Pennaz, Champlin, MN (US); Gary R. Tucholski, N. Royalton, OH (US)

(73) Assignee: Morgan Adhesives Company, Stow, OH (US)

( * ) Notice: Subject to any disclaimer, the term of this patent is extended or adjusted under 35 U.S.C. 154(b) by 145 days.

(21) Appl. No.: 09/742,492

(22) Filed: Dec. 20, 2000

Related U.S. Application Data

(60) Provisional application No. 60/172,738, filed on Dec. 20, 1999, provisional application No. 60/172,739, filed on Dec. 20, 1999, and provisional application No. 60/172,740, filed on Dec. 20, 1999.

(51) Int. Cl.[7] .......................... H01J 63/04; H01L 29/24

(52) U.S. Cl. ...................................... 313/506; 257/103

(58) Field of Search ................................ 313/498, 502, 313/503, 506, 509, 511; 362/363; 257/103

(56) References Cited

U.S. PATENT DOCUMENTS

| | | | | |
|---|---|---|---|---|
| 3,673,450 A | | 6/1972 | Leach | 313/506 |
| 3,784,414 A | | 1/1974 | Macaulay et al. | 136/175 |
| 3,889,357 A | | 6/1975 | Millard et al. | 29/570 |
| 4,064,288 A | | 12/1977 | Shah et al. | 427/58 |
| 4,105,807 A | | 8/1978 | Arora | 427/126 |
| 4,159,559 A | | 7/1979 | Robinson, Sr. | 313/506 |
| 4,277,974 A | | 7/1981 | Karr et al. | 73/339 |
| 4,482,841 A | * | 11/1984 | Tiku et al. | 313/503 |
| 4,547,703 A | * | 10/1985 | Fujita et al. | 257/43 |
| 4,560,902 A | * | 12/1985 | Kardon | 156/330 |
| 4,624,045 A | | 11/1986 | Ishihara et al. | 29/572 |
| 4,634,934 A | | 1/1987 | Tohda et al. | 315/169 |
| 4,665,342 A | | 5/1987 | Topp et al. | 313/505 |
| 4,666,576 A | | 5/1987 | Pliefke | 204/129 |
| 4,684,353 A | | 8/1987 | deSouza | 445/51 |
| 4,721,883 A | | 1/1988 | Jacobs et al. | 313/505 |
| 4,767,965 A | | 8/1988 | Yamano et al. | 313/491 |
| 4,816,356 A | | 3/1989 | Balkanski | 429/191 |
| 4,816,717 A | | 3/1989 | Harper et al. | 313/502 |
| 4,880,661 A | | 11/1989 | Endo et al. | 427/38 |
| 4,904,901 A | | 2/1990 | Simoportos et al. | 313/509 |

(List continued on next page.)

OTHER PUBLICATIONS

"EL Technology Provides Innovative Dashboard Lighting for Italian Sports Car" (A Dupont application profile—H78295 3/99).

"Dupont Luxprint Electroluminescent Inks" (L 11263 11/97 Dupont Photopolymer and Electronic Materials).

"A History and Technical Discussion of Electroluminescent Lamps" (Dupont Photopolymer & Electronic Materials).

"Let There Be Light: Screen Printing EL Lamps for Membrane Switches" Ken Burrows of EL Specialists Inc. as printed in the Jan. 1999 issue of "Screen Printing".

"Factors Affecting Light Output in Electroluminescence Lamps" Melvyn C. Rendle of Acheson Colloids presented at Jun. 28, 1999 Membrane Switch Symposium.

*Primary Examiner*—Don Wong
*Assistant Examiner*—Minh Dieu A
(74) *Attorney, Agent, or Firm*—Barnes & Thornburg

(57) ABSTRACT

The present invention is an improved EL lamp structure having a reduced number of printed component layers. The EL lamp utilizes a flexible dielectric film, such as polypropylene, polyethylene or polyethylene terephthalate (PET), that acts as a combination dielectric layer and structural substrate for the remaining layers of the EL lamp structure. The flexible dielectric film reduces the need for a separate dielectric layer and substrate layer. Furthermore, the flexible dielectric film eliminates the need for several printed dielectric layers, thus reducing production time and the occurrence of manufacturing defects during the printing process. In an alternate embodiment, a low cost flexible metalized film is used as a combination rear electrode, dielectric layer and substrate. This embodiment further reduces the number of printed component layers required in the EL lamp structure.

21 Claims, 2 Drawing Sheets

U.S. PATENT DOCUMENTS 4,936,924 A 6/1990 Inuzuka ...................... 136/249
4,977,007 A 12/1990 Kondo et al. ................. 428/76
4,983,497 A 1/1991 Gilson et al. ............... 430/272
4,999,936 A 3/1991 Calamia et al. ............... 40/544
5,013,967 A 5/1991 Hirotaka et al. ............ 313/512
5,041,326 A 8/1991 Schroeder et al. ............ 445/35
5,133,036 A * 7/1992 Tornqvist .................... 385/130
5,245,516 A 9/1993 de Haas et al. ............. 362/108
5,250,905 A 10/1993 Kuo et al. .................. 324/435
5,259,778 A 11/1993 Zhang ........................ 439/188
5,260,161 A 11/1993 Matsumura et al. ........ 430/161
5,264,714 A 11/1993 Nakaya et al. ................ 257/78
5,268,827 A 12/1993 Granneman et al. ........ 362/156
5,276,382 A 1/1994 Stocker et al. ........... 250/462.1
5,279,641 A 1/1994 Narisawa et al. ............. 75/353
5,332,946 A 7/1994 Eckersley et al. .......... 313/506
5,338,625 A 8/1994 Bates et al. ................. 429/193
5,339,024 A 8/1994 Kuo et al. .................. 324/435
5,346,770 A * 9/1994 Osada et al. ................ 428/334
5,359,261 A 10/1994 Kondo et al. ............... 313/509
5,396,177 A 3/1995 Kuo et al. .................. 324/435
5,410,217 A 4/1995 LaPointe .................... 313/509
5,411,592 A 5/1995 Ovshinsky et al. ......... 118/718
5,418,062 A 5/1995 Budd ......................... 313/506
5,437,692 A 8/1995 Dasgupta et al. ............. 29/623
5,445,906 A 8/1995 Hobson et al. ............. 429/162
5,469,019 A * 11/1995 Mori .......................... 313/502
5,471,773 A 12/1995 Hoffman ...................... 40/544
5,482,614 A 1/1996 Kondo et al. ............... 205/171
5,494,699 A 2/1996 Chung ......................... 427/66
5,512,147 A 4/1996 Bates et al. ................. 204/192
5,512,389 A 4/1996 Dasgupta et al. ........... 429/192
5,533,289 A 7/1996 Hoffman ...................... 40/544
5,552,668 A 9/1996 Hirose et al. ............... 313/506
5,565,733 A 10/1996 Krafcik et al. .............. 313/506
5,567,210 A 10/1996 Bates et al. ................... 29/623
5,573,807 A 11/1996 LaPointe ..................... 427/66
5,596,278 A 1/1997 Lin ............................ 324/435
5,597,183 A 1/1997 Johnson ....................... 283/83
5,598,058 A 1/1997 LaPointe .................... 313/503
5,612,152 A 3/1997 Bates ......................... 429/162
5,621,274 A 4/1997 McGuigan .................. 313/512
5,621,991 A 4/1997 Gustafson .................... 40/544
5,643,685 A 7/1997 Torikoshi .................... 428/690
5,665,490 A 9/1997 Takeuchi et al. ............ 429/192
5,667,417 A 9/1997 Stevenson .................... 445/24
5,680,160 A 10/1997 LaPointe .................... 345/173
5,681,402 A 10/1997 Ichinose et al. ............ 136/256
5,702,565 A * 12/1997 Wu et al. ..................... 117/44
5,726,953 A 3/1998 LaPointe et al. .............. 368/67
5,731,105 A 3/1998 Fleischer et al. ........... 429/192
5,770,920 A 6/1998 Eckersley et al. .......... 313/506
5,779,346 A 7/1998 Burke ......................... 362/84
5,780,965 A 7/1998 Cass et al. .................. 313/506
5,786,664 A 7/1998 Liu ............................ 313/506
5,789,860 A 8/1998 Inoguchi et al. ............ 313/506
5,797,482 A 8/1998 LaPointe et al. ............ 200/314
5,808,412 A 9/1998 Zovko et al. ............... 313/509
5,821,691 A 10/1998 Richie et al. ............... 313/506
5,830,028 A * 11/1998 Zovko et al. ................. 445/52
5,831,375 A 11/1998 Benson, Jr. ................. 313/110
5,856,029 A 1/1999 Burrows ..................... 313/502
5,917,278 A 6/1999 Miyauchi et al. ........... 313/506
5,957,564 A 9/1999 Bruce et al. ............. 315/169.3
5,958,610 A 9/1999 Yonekawa et al. .......... 428/690
6,036,823 A * 3/2000 Inoguchi et al. ....... 204/192.15
6,069,442 A 5/2000 Hung et al. ................. 313/504
6,100,478 A 8/2000 LaPointe et al. ............ 200/314
6,288,487 B1 * 9/2001 Arai ........................... 313/498
6,411,726 B1 * 6/2002 Pires .......................... 313/506

* cited by examiner-

ELECTROLUMINESCENT LAMP STRUCTURE

RELATED U.S. APPLICATION DATA

This application has priority to U.S. Provisional Applications 60/172,738, 60/172,739 and 60/172,740, all filed Dec. 20, 1999, and incorporated herein by reference.

BACKGROUND OF THE INVENTION

The present invention relates to electroluminescent (EL) lamps and more particularly to an improved EL lamp structure having fewer required printed component layers thereby improving manufacturing cycle time and product quality.

EL lamps are basically devices that convert electrical energy into light. AC current is passed between two electrodes insulated from each other and having a phosphorous material placed therebetween. Electrons in the phosphorous material are excited to a higher energy level by an electric field created between the two electrodes during the first quarter cycle of the AC voltage. During the second quarter cycle of the AC voltage, the applied field again approaches zero. This causes the electrons to return to their normal unexcited state. Excess energy is released in the form of a photon of light when these electrons return to their normal unexcited state. This process is repeated for the negative half of the AC cycle. Thus, light is emitted twice for each full cycle (Hz). Various properties of the emitted light can be controlled by varying this frequency, as well as the applied AC voltage. In general, the brightness of the EL lamp increases with increased voltage and frequency.

Prior art EL lamps typically comprise numerous component layers. At the light-emitting side of an EL lamp (typically the top) is a front electrode, which is typically made of a transparent, conductive indium tin oxide (ITO) layer and a silver bus bar to deliver maximum and uniform power to the ITO. Below the ITO/bus bar layers is a layer of phosphor, followed by a dielectric insulating layer and a rear electrode layer. All of these layers are typically disposed on a flexible or rigid substrate, which is typically polyester. In some prior art EL lamps, the ITO layer is sputtered on a polyester film, which acts as a flexible substrate. A relatively thick polyester film, typically four or more mils thick, is necessary because the rigidity is required for the screen printing of the layers. The EL lamp construction may also include a top film laminate or coating to protect the component layers of the EL lamp construction.

The component layers of an EL lamp are typically constructed from a variety of materials, including films and electrodes, polymeric films, printed layers, encapsulants, epoxies, coatings or combinations thereof if these layers are printed, they.are normally printed by means of a flat bed screen method and are then batch dried, except for the base substrate and top film laminate. Some of the required layers must be printed more than once in order to assure proper thickness. For example, the dielectric material needs sufficient thickness to prevent pinholes or voids, which may cause shorting between the electrodes. On the other hand, the dielectric layer is prone to cracking when multiple layers are printed one over the other. Thus, control over the printing process for the dielectric layer is extremely important. If the dielectric is too thick, the required operating power and frequency to achieve a given brightness must be increased. Also the chances of cracking will be increased; thus, consistent dielectric thickness in production of EL lamps is important to ensure consistent lamp brightness across a given production run of lamps.

Another limitation of a multilayer printed dielectric is the effect it has on the quality of the other component layers that are printed thereon. For example, the printed phosphor layer must be smooth and consistent to ensure uniform lighting from the excited phosphor. If the multilayer printed dielectric layer is inconsistent, then the phosphor layer printed on the dielectric layer will also be inconsistent. An inconsistent printed dielectric layer will also affect other subsequently printed layers, including the transparent electrode layer. Thus, a smooth dielectric layer is important to ensure the quality of all the subsequent printed layers and ultimately the quality of the EL lamp.

Another drawback of utilizing multi-printed layers is the effect on production cycle time. Each of the printed layers of the EL lamp structure, with the exception of the base substrate and top film laminate, has to be printed and then dried before another printed layer is applied. This is a very time-consuming and expensive process, especially for printing the multilayered dielectric.

It is therefore an object of the present invention to provide an EL lamp structure that reduces the number of printed layers by utilizing a dielectric film in lieu of a printed dielectric layer, thus reducing the printing and drying time in the production process and increasing the reliability and quality of the EL lamp.

It is also an object of the present invention to provide an EL lamp structure that utilizes a dielectric film in lieu of a printed dielectric layer, thus eliminating the need to print on top of the thick printed dielectric layer and thereby improving the print quality of the phosphor and transparent electrode layers.

It is another object of the present invention to provide an EL lamp structure that utilizes a dielectric film in lieu of a printed dielectric layer, thus greatly reducing the possibility of shorting between the electrodes of the EL lamp.

It is a further object of the present invention to provide an alternate EL lamp structure that further reduces the required number of component layers by utilizing a metalized film that acts as both a rear electrode and a dielectric layer, thus even further reducing the printing and drying time in the production process and increasing the reliability and quality of the EL lamp.

These and other objects and advantages of the invention will be apparent from the following description, the accompanying drawings and the appended claims.

SUMMARY OF THE INVENTION

The present invention is an improved EL lamp structure having a reduced number of structural or component layers and therefore fewer printed component layers. The EL lamp utilizes a flexible dielectric film, such as polypropylene, polyethylene or polyethylene terephthalate (PET), that acts as a combination dielectric layer and structural substrate for the remaining layers of the EL lamp structure. The flexible dielectric film reduces the need for a separate dielectric layer and substrate layer. Furthermore, the flexible dielectric film eliminates the need for several printed dielectric layers, thus reducing production time and the occurrence of manufacturing defects during the printing process.

The remaining structure of the EL lamp is applied to the flexible dielectric film substrate. A phosphor layer is printed on the top side of the dielectric film. Since a dielectric film is being used, the print quality of the phosphor printed upon the smooth film surface will be more consistent than if the phosphor was printed on several layers of a printed dielectric ink. A transparent electrode layer, such as printable indium tin oxide (ITO), is printed on the phosphor layer. A front bus bar is then printed on the transparent electrode layer. The front bus bar is typically printed with silver or carbon ink. A rear electrode can be printed on the bottom surface of the dielectric film. The application of a top and/or bottom laminate, lacquer, or the like is optional and helps protect the EL lamp structure from adverse environmental conditions as well as protecting users from electrical hazards. A laminate or similar coating will particularly protect the phosphor layer from moisture damage.

In an alternate embodiment, a low cost commercially available flexible metalized film is used as a combination rear electrode, dielectric layer and substrate. This embodiment further reduces the number of printed component layers required in the EL lamp structure. Typical metalized film has aluminum, copper, or other metallic conductive material deposited on one side of the film by vapor deposition, sputtering, plating, printing or other metallic deposit techniques known in the art. The deposited metallic layer acts as the rear electrode and the film material, such as a polyester resin, acts as the dielectric layer. The film also acts as a substrate for application of the remaining printed component layers.

DETAILED DESCRIPTION OF THE INVENTION

While the present invention will be described fully hereinafter with reference to the accompanying drawings, in which a particular embodiment is shown, it is to be understood at the outset that persons skilled in the art may modify the invention herein described while still achieving the desired result of this invention. Accordingly, the description that follows is to be understood as a broad informative disclosure directed to persons skilled in the appropriate art and not as limitations of the present invention.

Figure 1:
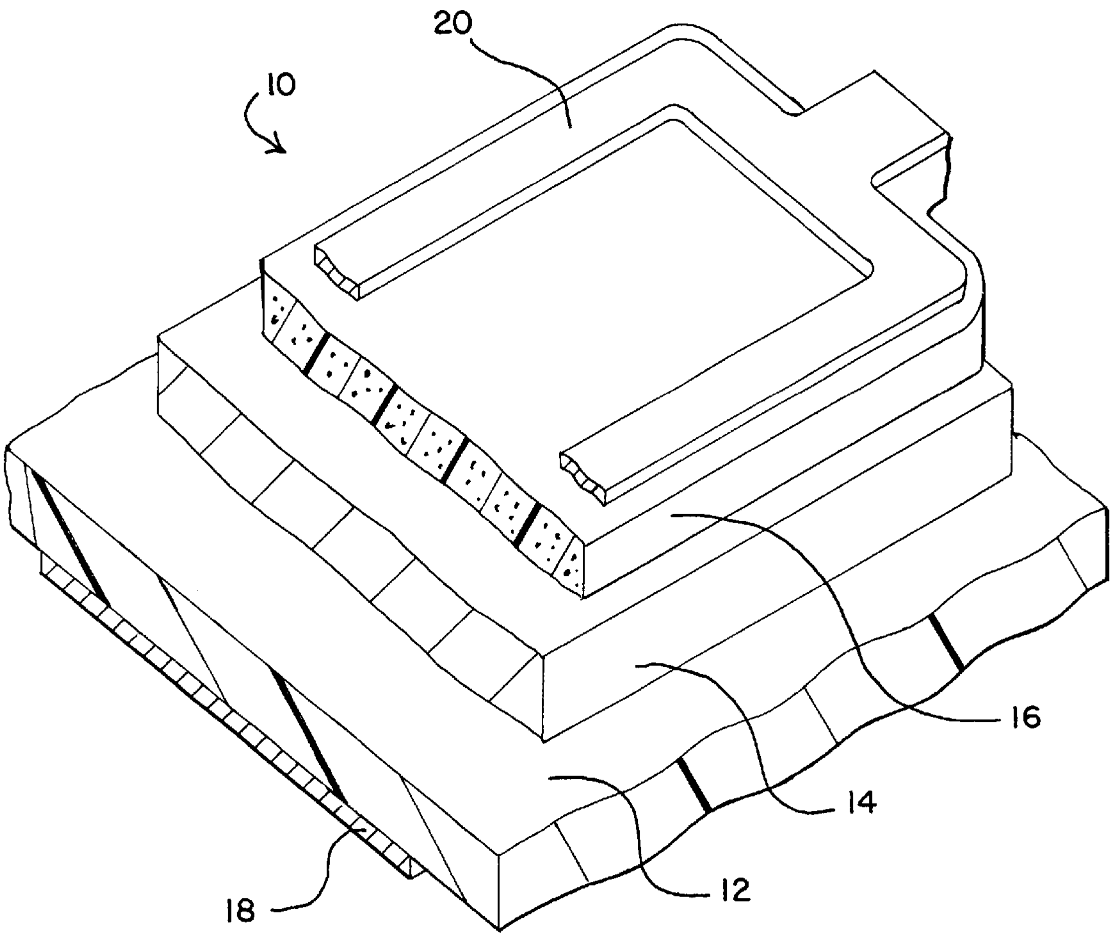
FIG. 1 is a partly cutaway perspective view of a first embodiment of an EL lamp structure constructed according to the present invention.
Figure 2:
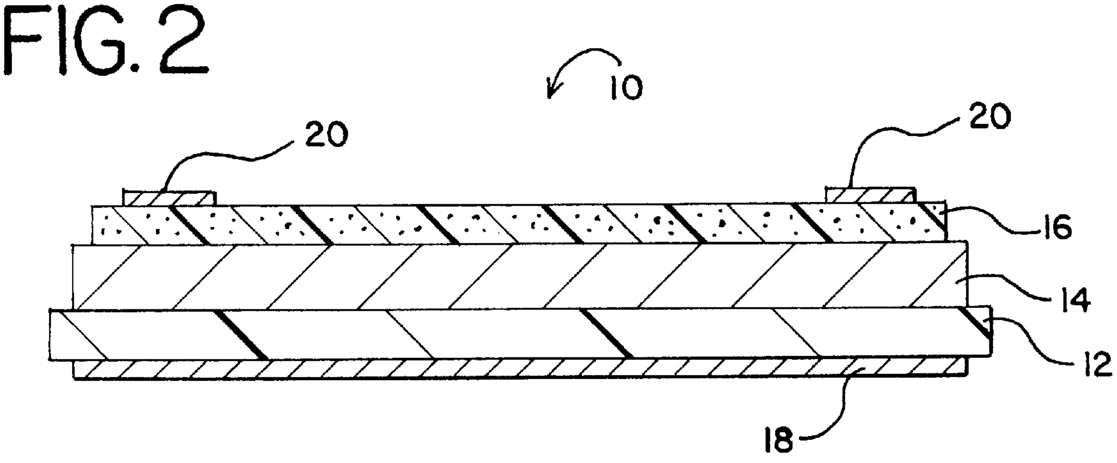
FIG. 2 is a cross-sectional side view of the first embodiment of the EL lamp structure of FIG. 1.

FIGS. 1 and 2 show a basic EL lamp 10 constructed according to the present invention. In this embodiment, the EL lamp 10 utilizes a flexible dielectric film 12, such as polypropylene, polyethylene or polyethylene terephthalate (PET), that acts as a combination dielectric layer and structural substrate for the remaining layers of the structure of the EL lamp 10. Other films that may make acceptable dielectric films include KAPTON by E. I. Du Pont de Nemours and Co., polycarbonate, polysulfone, polystyrene and impregnated film. Any printable dielectric film is suitable that can handle curing temperature and processing as necessary. A PET film is preferred, but polypropylene is acceptable where the factors of film thickness and the dielectric constant are balanced to select the desired film. The dielectric film 12 is rigid enough to act as a substrate. The flexible dielectric film 12 also possesses suitable dielectric properties for EL lamp applications. Depending on various design parameters, the light output will vary considerably relative to the thickness of the dielectric layer at a given operating voltage and frequency. Typically, a thicker dielectric layer will require a higher operating power and frequency to achieve a given lamp brightness compared to a thinner layer. Furthermore, the higher the dielectric constant of the material, the greater the brilliance of the lamp.

In any given EL lamp design, it is important to maintain enough thickness to prevent voltage breakdown between the electrodes of the EL lamp, which results in lamp malfunction and/or failure.

A layer of phosphor 14 is printed on the dielectric film 12. Printable phosphor compositions are available to emit light in many colors such as green, blue, or yellow. Phosphor compositions can also be blended or dyed to produce a white light. Typical EL phosphors are a zinc sulfide-based material doped with the various compounds to create the desired color. The phosphor layer 14 is printed by rotary screen printing, flexographic printing, or other high-speed printing methods. The printed phosphor layer 14, which also acts as a secondary dielectric layer, must be smooth and consistent to ensure uniform lighting from the excited phosphor. As opposed to a printed dielectric surface used in prior art structures, the dielectric film 12 provides a smooth surface for the application of the phosphor layer 14. This smooth surface promotes an evenly distributed printed phosphor layer 14 and thus provides higher quality lighting.

A transparent electrode layer 16 is disposed on the phosphor layer 14, as shown in FIGS. 1 and 2. In a preferred embodiment, the transparent electrode layer 16 is a conductive indium tin oxide (ITO) layer, which is printed within the phosphor layer as shown in FIGS. 1 and 2. This will minimize potential shorting problems due to possible misregistration in the printing process or the remote possibility of a defective film. A bus bar 20 is printed on the inside of the transparent electrode layer 16 as shown in FIGS. 1 and 2. This provides a means for electrically connecting the transparent electrode and uniformly distributing the power within the whole lamp. The transparent electrode layer 16 together with a rear electrode layer 18 disposed on the bottom of the dielectric film layer 12 provide two parallel conductive electrodes that create the capacitance required for the excitation of the phosphor layer 14 during operation of the EL lamp 10. The emitted light is visible through the top transparent electrode layer 16. In the embodiment shown in FIGS. 1 and 2, a rear electrode layer 18 can be printed on the dielectric film 12 with an ITO, silver or carbon ink. A bus bar 20 can be printed on the transparent electrode layer 16 and provide a means for electrically connecting the transparent electrode. The bus bar 20 can be printed with a carbon, silver, or a conductive ink. A laminate, lacquer, or the like 98 can be applied to the top and/or bottom of the EL lamp structure in order to protect the EL lamp structure from adverse environmental conditions, damage from ordinary handling and use, and electrical hazards to the users. A laminate or similar coating 98 will also protect the phosphor layer 14 from moisture damage. The life and light-emitting capabilities of the phosphor layer 14 are reduced by exposure to moisture. Alternately, a formulation of phosphor ink that has phosphor particles encapsulated in silica can also be used to minimize moisture damage. The silica acts as a moisture barrier and does not adversely affect the light-emitting capability of the phosphor when exposed to the electric field generated between the electrodes of the EL lamp.

The use of a flexible dielectric film 12 in the EL lamp embodiment shown in FIGS. 1 and 2 eliminates the need for a separate dielectric layer and substrate layer in the EL lamp structure. Furthermore, the use of the dielectric film 12 also eliminates the need to dispose several printed dielectric layers on a substrate, as in prior art EL lamp structures. The elimination of these printed layers increases the quality of the dielectric layer by reducing the possibility of manufacturing defects during the printing process. Appearance defects as well as pinholes or other voids can occur in the dielectric layer if this layer is printed. The pinholes can cause electrical shorting between the transparent electrode layer 16 and the rear electrode layer 18 and result in malfunctioning or failure of the lamp. Cracking, appearance defects, and other inconsistencies, such as inconsistent thickness, can also occur when layers are printed on top of another layer. This ultimately affects the quality of subsequently printed component layers, especially the printed phosphor layer 14. Furthermore, the elimination of several printed layers also greatly reduces the production time required to manufacture printed EL lamps. The overall production cycle time of an EL lamp is reduced due to a decrease in the required printing and drying times for each of the individual printed layers.

Figure 3:
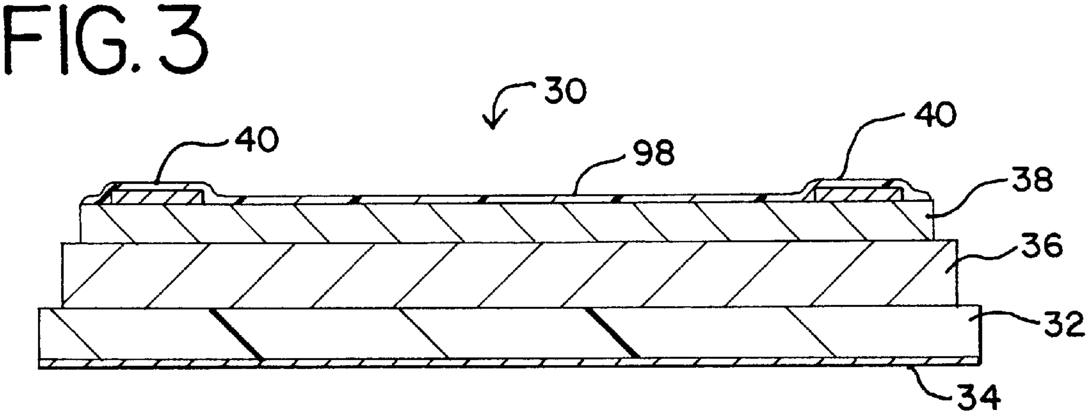
FIG. 3 is a cross-sectional side view of a second embodiment of an EL lamp structure constructed according to the present invention.

FIG. 3 shows an alternate embodiment EL lamp 30 that further reduces the number of component layers as required by prior art EL lamp structures. In this embodiment, a low cost flexible metalized film 32 is used as a combination rear electrode, dielectric layer and substrate. Aluminum, copper or other metallic conductive material is deposited on one side of the film 32 by vapor deposition, sputtering, plating, printing or other metallic deposit techniques known in the art to create a metallic layer 34. The flexible metalized film 32 is readily commercially available for use in this application as a component part. The metallic layer 34 acts as the rear electrode, and the film material acts as the dielectric layer. The film material is typically made from a polyester resin such as Mylar® Capacitor Grade (manufactured by DuPont-Teijin Films®). A flourocarbon resin can also be used. The film 32 is typically about 0.0002" to about 0.0010" thick and is rigid enough to act as a substrate for application of the remaining printed component layers of the EL lamp 30. The remaining component layers are disposed on the metalized film 32 in a fashion similar to the application of the component layers to the dielectric film 12 in the embodiment shown in FIGS. 1 and 2. A phosphor layer 36 is printed on the metalized film 32, and a transparent electrode layer 38, such as printable ITO, is then printed on the phosphor layer 36. A bus bar 40 is pattern printed on a portion of the transparent electrode layer 38 to complete the structure of the EL lamp 30. This border pattern would have a similar geometry of the ITO perimeter. Protective coatings can also be used in this embodiment.

Figure 4:
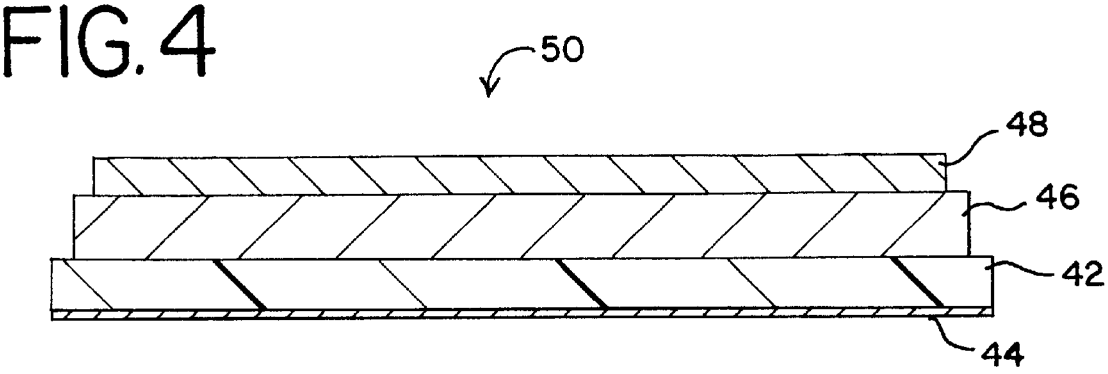
FIG. 4 is a cross-sectional side view of a third embodiment of an EL lamp structure constructed according to the present invention.

FIG. 4 shows another alternate embodiment EL lamp 50 that still further reduces the number of component layers as required by prior art EL lamp structures. In this embodiment, a flexible metalized film 42 is used as a combination rear electrode, dielectric layer and substrate. Metallic material is deposited on one side of the film 42 by deposit techniques known in the art to create a metallic layer 44. The flexible metalized film 42 is readily commercially available for use in this application as a component part. The metallic layer 44 acts as the rear electrode, and the film material acts as the dielectric layer. The film material is typically made from a polyester resin such as Mylar® Capacitor Grade. The film 42 is rigid enough to act as a substrate for application of the remaining printed component layers of the EL lamp 50. A phosphor layer 46 is printed on the metalized film 42, and a transparent electrode layer 48, such as printable ITO, is then printed on the phosphor layer 46. With an optimized EL lamp design for geometry and size in combination with the proper dielectric film constant and thickness, the normal transparent electrode bus bar 20 of FIGS. 1 and 2 can be eliminated. This results in an EL lamp that can be printed with only two layers.

The nominal voltage and frequency for the EL lamps described herein are typically 115 Volts (AC) and 400 Hz. However, these EL lamps can be made for operation from approximately 40–200 Volts (AC) and 50–5000 Hz. The EL lamps can be operated directly from an AC power source or from a DC power source. If a DC power source is used, such as batteries, an inverter is required to convert the DC current to AC current. In larger applications, a resonating transformer inverter can be used. This typically consists of a transformer in conjunction with a transistor and resistors and capacitors. In smaller applications, such as placement on PC boards having minimal board component height constraints, an IC chip inverter can generally be used in conjunction with capacitors, resistors and an inductor.

Various properties of the emitted light from the EL lamp can be controlled by varying.the frequency as well as the applied AC voltage. Typically, the brightness of the EL lamp increases with power and frequency. Unfortunately, when the operating power and/or frequency of an EL lamp are increased, the life of the EL lamp will decrease. Therefore, in addition to various other design constraints, these properties must be balanced against the desired product life of the EL lamp in order to determine the proper operating voltage and/or frequency. In considering these variables, it is important to prevent voltage breakdown across the electrodes of the EL lamp, which results in lamp malfunction or failure.

While above-mentioned features of this invention and the manner of obtaining them may be apparent to understand the method of producing EL lights, the inventive method itself may be best understood by reference to the following description taken in conjunction with the above identified features.

A substrate film is supplied that acts as the dielectric for the EL lamp. The rear electrode of carbon or silver ink can be reverse printed on the substrate or a conductive metalization layer can be applied, preferably before the phosphor layer is applied on the other side. A metalization layer is less expensive than a carbon or silver ink. Also, the substrate film supplied may be a metalized film with a conductive surface that is the rear electrode, dielectric layer and substrate. For unidirectional lights, a bottom laminate can be applied over the printed electrode or metalization layer, if necessary. The phosphor can be printed on a very smooth substrate without other layers that may be potentially uneven or cracked. If necessary, a second phosphor layer may be applied. A transparent electrode (ITO) can be printed over the phosphor layer. High-speed printing methods are preferred for these layers with flexographic printing as the ideal method. A bus bar of silver or carbon is then pattern printed over the transparent electrode for example in the pattern of a football goal post. A varnish can be applied or a translucent top.film can be laminated over the patterned bus bar and the exposed portion of the transparent electrode to encapsulate and protect the underlying components. The process has been reduced to the application of three or four layers, depending on whether a second phosphor layer is applied, rather than seven or more layers of the prior art. A varnish protective layer adds another step, but is generally preferred to an overlaminate film.

This EL Lamp method can be manufactured on high-speed equipment that may operate at speeds of more than 100 feet (30 meters) per minute on high volume commercial printing, drying, laminating, punching, and blanking equipment. This equipment replaces the flat bed screen processing of prior methods.

Such a method is suitable for high-speed processing and will require less stations and less time between steps while producing a lamp that is more consistent and prone to fewer problems, such as cracking or pin holes in the dielectric. Previously problems in the dielectric were not discovered until nearly, all steps of the method were completed, but in the present method the dielectric film is qualified prior to printing; therefore, greatly reducing the chance of having a defective EL Lamp.

Although the preferred embodiment of the invention is illustrated and described in connection with a particular type of components, it can be adapted for use with a variety of EL lamps. Other embodiments and equivalent lamps and methods are envisioned within the scope of the invention. Various features of the invention have been particularly shown and described in connection with the illustrated embodiments of the invention, however, it must be understood that these particular embodiments merely illustrate and that the invention is to be given its fullest interpretation within the terms of the appended claims.

What is claimed is:

1. An electroluminescent lamp comprising:

a dielectric film having a top surface and a bottom surface; the dielectric film serving as a substrate;

a phosphor layer on the top surface of the dielectric film;

a transparent electrode layer on the phosphor layer;

a bus bar on the transparent electrode layer for electrically connecting the transparent electrode and uniformly distributing power within the lamp; and a rear electrode disposed on the bottom surface of the dielectric film;

wherein the transparent electrode layer together with the rear electrode provide two parallel conductive electrodes that create the capacitance required for the excitation of the phosphor layer during operation of the lamp.

2. The lamp of claim 1 wherein the rear electrode layer is printed on the dielectric film with an ink including one or more of components of the following group: indium tin oxide, silver and carbon ink.

3. The lamp of claim 1 wherein the dielectric film includes a flexible substrate selected from a group of polypropylene, polyethylene and polyethylene terephthalate.

4. The lamp of claim 1 wherein the dielectric film includes a flexible substrate selected from a group of polycarbonate, polysulfone, polystyrene and impregnated films.

5. The lamp of claim 1 wherein the transparent electrode layer is a conductive indium tin oxide layer.

6. The lamp of claim 1 further comprising a protective laminate as an outermost layer.

7. The lamp of claim 1 further comprising a protective lacquer as an outermost layer.

8. A flexible thin film device that converts electrical energy into light with two electrodes insulated from each other, the flexible thin film device comprising:

a flexible metalized film including a film substrate material adapted to function as a dielectric layer and a metallic layer deposited on one side of the film substrate material adapted to function as an electrode;

a phosphor layer on the film substrate material; and a transparent electrode layer on the phosphor layer, wherein the flexible metalized film is a combined electrode, dielectric layer, and substrate.

9. The device of claim 8 wherein the transparent electrode layer is an indium tin oxide layer.

10. The device of claim 8 further comprising a bus bar in a pattern on a portion of the transparent electrode layer.

11. The device of claim 8 consisting of only two layers on the flexible metalized film.

12. The device of claim 8 further comprising a protective laminate as an outermost layer.

13. The device of claim 8 further comprising a protective lacquer as an outermost layer.

14. The device of claim 8 wherein phosphor particles of the phosphor layer are encapsulated in Silica.

15. A method of making an electroluminescent lamp comprising the steps of:

providing a substrate film with a smooth top surface that acts as a dielectric for the electroluminescent lamp and a bottom surface that acts as a rear electrode;

depositing a smooth and consistent phosphor layer on the smooth top surface of the dielectric film; and depositing a transparent electrode layer on the phosphor layer.

16. The method of claim 15 wherein the layers are deposited with flexographic printing.

17. The method of claim 15 including an additional step of depositing a bus bar over the transparent electrode in a pattern.

18. The method of claim 17 wherein the layers and bus bar are deposited by printing.

19. The method of claim 17 including an additional step of applying a varnish over the bus bar and an exposed portion of the transparent electrode to encapsulate and protect underlying components.

20. The method of claim 17 including an additional step of laminating a translucent top film over the bus bar and an exposed portion of the transparent electrode to encapsulate and protect underlying components.

21. The method of claim 15 wherein the bottom surface of the substrate film is a metallic layer.

* * * * *